(12) United States Patent
Huang et al.

(10) Patent No.: US 9,799,550 B2
(45) Date of Patent: Oct. 24, 2017

(54) MANUFACTURING METHOD FOR FORMING A SEMICONDUCTOR STRUCTURE

(71) Applicant: UNITED MICROELECTRONICS CORP., Hsin-Chu (TW)

(72) Inventors: Wei-Hao Huang, New Taipei (TW); Chia-Lin Lu, Taoyuan (TW); Chun-Lung Chen, Tainan (TW); Kun-Yuan Liao, Hsin-Chu (TW); Feng-Yi Chang, Tainan (TW); Chieh-Te Chen, Kaohsiung (TW); Shang-Yuan Tsai, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 139 days.

(21) Appl. No.: 14/845,294

(22) Filed: Sep. 4, 2015

(65) Prior Publication Data
US 2017/0069528 A1    Mar. 9, 2017

(51) Int. Cl.
*H01L 21/02* (2006.01)
*H01L 21/441* (2006.01)
*H01L 21/768* (2006.01)
*H01L 21/311* (2006.01)
*H01L 21/033* (2006.01)
*H01L 29/417* (2006.01)
*H01L 29/78* (2006.01)

(52) U.S. Cl.
CPC .... *H01L 21/76802* (2013.01); *H01L 21/0332* (2013.01); *H01L 21/31144* (2013.01); *H01L 21/76877* (2013.01); *H01L 21/76897* (2013.01); *H01L 29/41791* (2013.01); *H01L 2029/7858* (2013.01)

(58) Field of Classification Search
CPC ......... H01L 21/76802; H01L 21/76805; H01L 21/76877; H01L 21/76897; H01L 21/0271; H01L 21/0273; H01L 21/0274; H01L 21/0276; H01L 21/033; H01L 21/0332; H01L 21/0334; H01L 21/0335; H01L 21/823431; H01L 29/41791; H01L 2029/7858
See application file for complete search history.

(56) References Cited

U.S. PATENT DOCUMENTS 7,619,731 B2    11/2009  Lally
8,101,092 B2    1/2012   Feng
(Continued)

*Primary Examiner* — Robert Bachner
*Assistant Examiner* — Molly Reida
(74) *Attorney, Agent, or Firm* — Winston Hsu

(57) ABSTRACT

The present invention provides a method for forming an opening, including: first, a hard mask material layer is formed on a target layer, next, a tri-layer hard mask is formed on the hard mask material layer, where the tri-layer hard mask includes an bottom organic layer (ODL), a middle silicon-containing hard mask bottom anti-reflection coating (SHB) layer and a top photoresist layer, and an etching process is then performed, to remove parts of the tri-layer hard mask, parts of the hard mask material layer and parts of the target layer in sequence, so as to form at least one opening in the target layer, where during the step for removing parts of the hard mask material layer, a lateral etching rate of the hard mask material layer is smaller than a lateral etching rate of the ODL.

18 Claims, 5 Drawing Sheets

(56) References Cited

U.S. PATENT DOCUMENTS 8,435,901 B2 5/2013 Zin
2014/0199837 A1* 7/2014 Hung ............... H01L 21/76816
438/675

* cited by examiner

MANUFACTURING METHOD FOR FORMING A SEMICONDUCTOR STRUCTURE

BACKGROUND OF THE INVENTION

1. Field of the Invention

The present invention relates generally to semiconductor manufacturing process, and more specifically, to a method for forming a self aligned contact having better quality through a plurality of photolithography processes.

2. Description of the Prior Art

Along with the continuous miniaturization of Integrated Circuits (IC), the line width of interconnections and the feature size of semiconductor devices have continuously shrunk. In general, discrete devices in integrated circuits are connected to each other through contact plugs (or contact slots) and interconnection structures, and their related fabrication methods have become an important matter in the next-generation semiconductor devices.

In current fabricating processes, due to the limitations of the back end of the line (BEOL) process capacity, the yield of contact plugs with high aspect ratio (HAR) is relatively low and cannot reach the new requirements. In order to overcome this drawback, a contact can be divided into two parts, a lower contact structure and an upper contact structure (i.e. the metal level zero, M0). After the lower contact structure is formed completely, the M0 is continuously formed. The M0 can be a pole structure or a slot structure. However, some issues such as over-etching or mis-alignment may occur during the process for forming the M0 contact holes, thereby affecting the conductivity of the contact.

Accordingly, in order to overcome the above-mentioned drawbacks, there is a need to provide a modified method for fabricating interconnection structures with better yields.

SUMMARY OF THE INVENTION

The present invention provides a method for forming an opening, comprising: first, a hard mask material layer is formed on a target layer (first interlayer dielectric, first ILD), next, a tri-layer hard mask is formed on the hard mask material layer, wherein the tri-layer hard mask includes an bottom organic layer (ODL), a middle silicon-containing hard mask bottom anti-reflection coating (SHB) layer and a top photoresist layer, and an etching process is then performed, to remove parts of the tri-layer hard mask, parts of the hard mask material layer and parts of the target layer in sequence, so as to form at least one opening in the target layer, wherein during the step for removing parts of the hard mask material layer, a lateral etching rate of the hard mask material layer is smaller than a lateral etching rate of the ODL.

In one embodiment of the present invention, the hard mask material layer is a light absorbing (DUO) layer.

In summary, the feature of the present invention is besides forming the tri-layer hard mask on a target layer (in this present invention, the target layer is the first ILD), further forming the hard mask material layer disposed between the first ILD and tri-layer hard mask. Since during the step for removing or patterning parts of the hard mask material layer, a lateral etching rate of the hard mask material layer is smaller than a lateral etching rate of the ODL, the pullback issue will not occur on the sidewall of the hard mask material layer, thereby preventing the contact holes from shorting or mis-alignment.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 8-10 are schematic diagrams illustrating a manufacturing method of the semiconductor device according to a third preferred embodiment of the present invention, wherein FIG. 9 shows a top view diagram of the semiconductor device.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
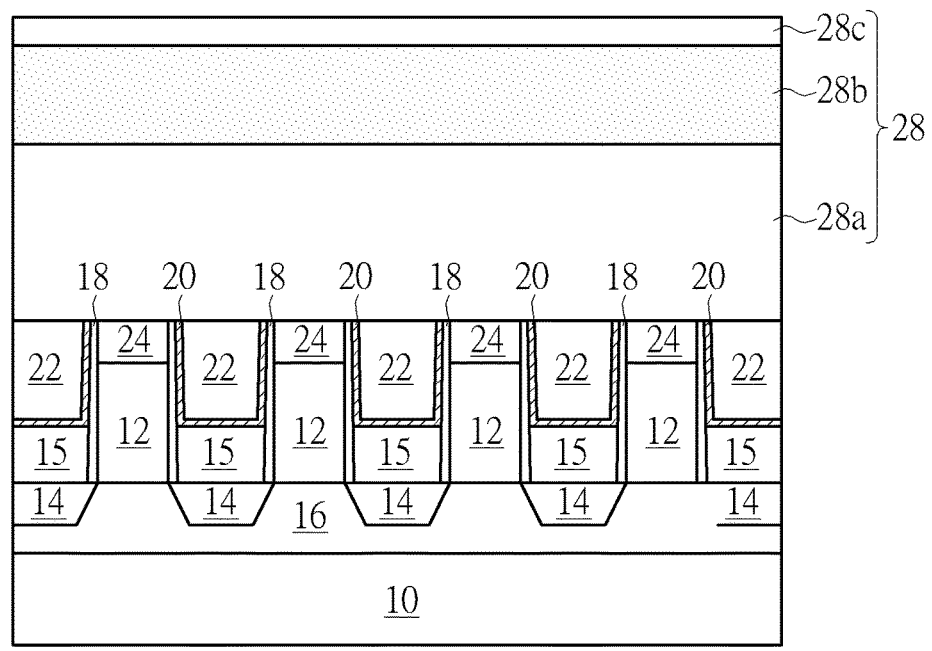
FIGS. 1-3 are schematic diagrams illustrating a manufacturing method of the semiconductor device according to a first preferred embodiment of the present invention.
Figure 2:
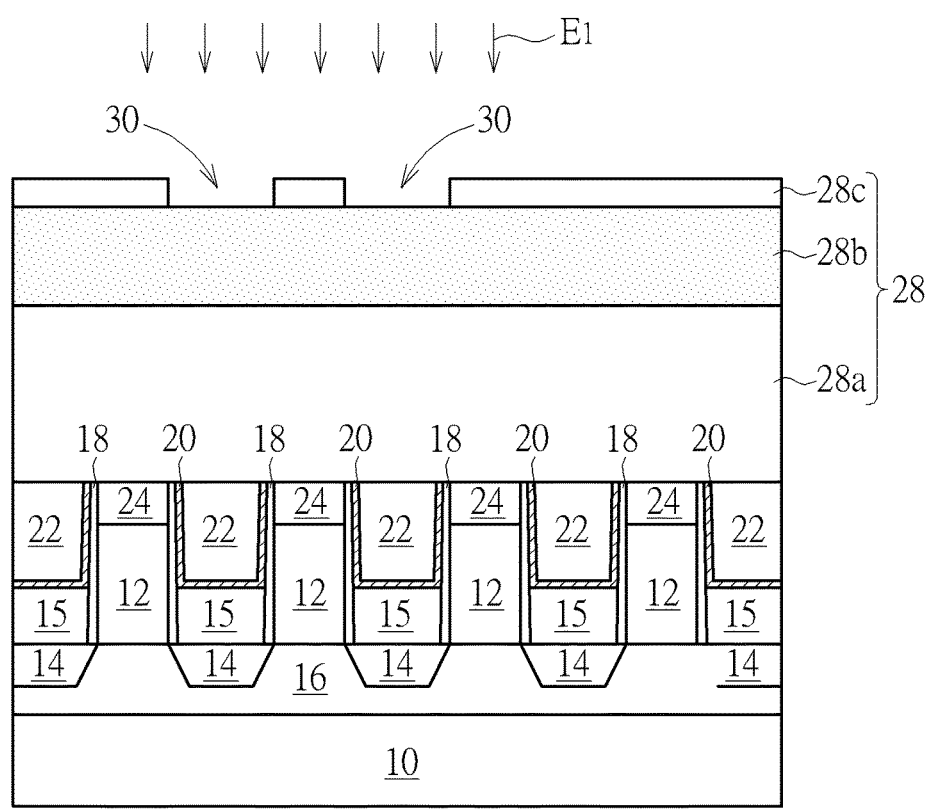
Figure 3:
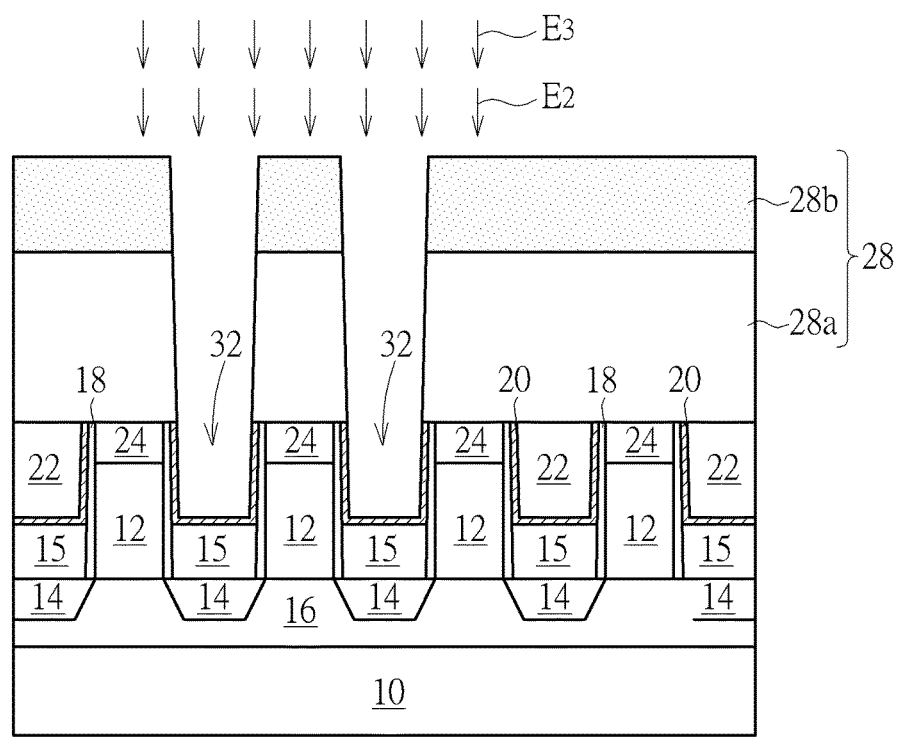

Please refer to FIGS. 1-3 are schematic diagrams illustrating a manufacturing method of the semiconductor device according to a first preferred embodiment of the present invention. As shown in FIG. 1, a substrate 10 is first provided, wherein the substrate 10 comprises at least one metal gate 12 disposed on the substrate 10, and at least one source/drain region (S/D region) 14 disposed on at least one side of the metal gate 12. Besides, the substrate 10 selectively comprises at least one fin structure 16. In this embodiment, the metal gate 12 comprises metal materials, the S/D region 14 can be formed on two sides of the metal gate 12 of the substrate 10 through an ion implantation process, or formed on the fin structure 16 disposed on two sides of the metal gate 12. The method of the present invention further comprises forming at least one shallow trench isolation (STI, not shown) in the substrate 10 surrounding the metal gate 12, to isolate the metal gate 12 from other electric elements on the substrate 10.

In addition, the method of the present invention further comprises selectively forming an epitaxy layer 15 on the S/D region 14. The epitaxy layer 15 can be regarded as a part of the S/D region 14. Afterwards, a spacer 18 and a contact etching stop layer (CESL) 20 may be formed on two sides of the metal gate 12. A first inter-layer dielectric (ILD) 22 is then formed on the substrate 10, and a planarization process is then performed, such as a chemical mechanical polishing (CMP), to have the top surface of the metal gate 12 and the top surface of the first inter-layer dielectric 22 on the same level. Please note that the metal gate 12 can be formed by replacing a dummy gate with metal after the planarization process. It is worth noting that in this embodiment, a hard mask 24 can be selectively formed, disposed on the metal gate 12. The manufacturing method of the hard mask comprises: after the metal gate 12 is completed, an etching process is performed to remove parts of the metal gate 12, and the hard mask 24 is then formed on the metal gate 12. Another planarization process is then performed to remove the extra hard mask 24. In other words, in the present embodiment, the top surface of the hard mask 24 and the top surface of the first inter-layer dielectric 22 are on the same level (as shown in FIG. 1). Besides, since the hard mask 24 replaces some top portion of the metal gate 12, the hard mask 24 is therefore disposed only on the metal gate 12, and disposed between the spacers 18. But it is noteworthy that the present invention is not limited to form the hard mask, in another case, there is no hard mask formed on the metal gate 12.

In addition, since parts of the spacer 18 and parts of the CESL 20 are removed during another planarization process, the spacer 18 and the CESL 20 have a truncated top surface. In the present embodiment, the thickness of the CESL 20 is about 50 angstroms, and the thickness of the hard mask 24 is about 350 angstroms, but not limited thereto. Besides, the spacer 18, the CESL 20 and the hard mask 24 mainly comprise silicon nitride, and the first inter-layer dielectric 22 mainly comprises silicon oxide, but not limited thereto. These elements and the manufacturing methods thereof are well known to persons of ordinary skills in the art and the details will not be described here.

Afterwards, a tri-layer hard mask 28 is then formed on the first ILD 22 and on the hard mask 24 (in the case the hard mask 24 is formed), the tri-layer hard mask 28 sequentially includes an organic dielectric layer (ODL) 28a, a silicon-containing hard mask bottom anti-reflecting coating (SHB) 28b and a photoresist (PR) layer 28c. In short, the tri-layer hard mask 28 is a tri-layer structure consisting of an ODL/SHB/PR structure, but not limited thereto.

Afterwards, as shown in FIGS. 2-3, in order to form the metal plug that is electrically connected to the S/D region 14 (wherein the metal plug can replace the M0 and the lower contacts structure electrically connected to the S/D region in conventional process, denoted here as the 0th metal contact, M0CT), a M0CT etching process is performed through a first photomask (not shown), which comprises a first etching process E1 for patterning the photoresist layer 28c and to form a plurality of first patterns 30 on the photoresist layer 28c. The first etching process E1 comprises lithography and development. In addition, as shown in FIG. 3, the M0CT etching process further comprises a second etching process E2 and a third etching process E3, wherein the second etching process E2 is used for etching the SHB layer 28b and the ODL 28a, the third etching process E3 is used for etching the first ILD 22. The second etching process E2 and the third etching process E3 are performed in sequence, to transfer the first patterns 30 to other layers disposed below, including the SHB layer 28b, the ODL 28a and the first ILD 22, so as to form a plurality of openings (contact holes) 32 at least in the first ILD 22, and the S/D region 14 or the epitaxial layer 15 is finally exposed by the contact holes 32. It is noteworthy that since the opening (contact hole) should be formed in first ILD 22, the first ILD 22 is deemed as the target layer disposed under the tri-layer hard mask, and having the contact holes formed therein.

Figure 4:
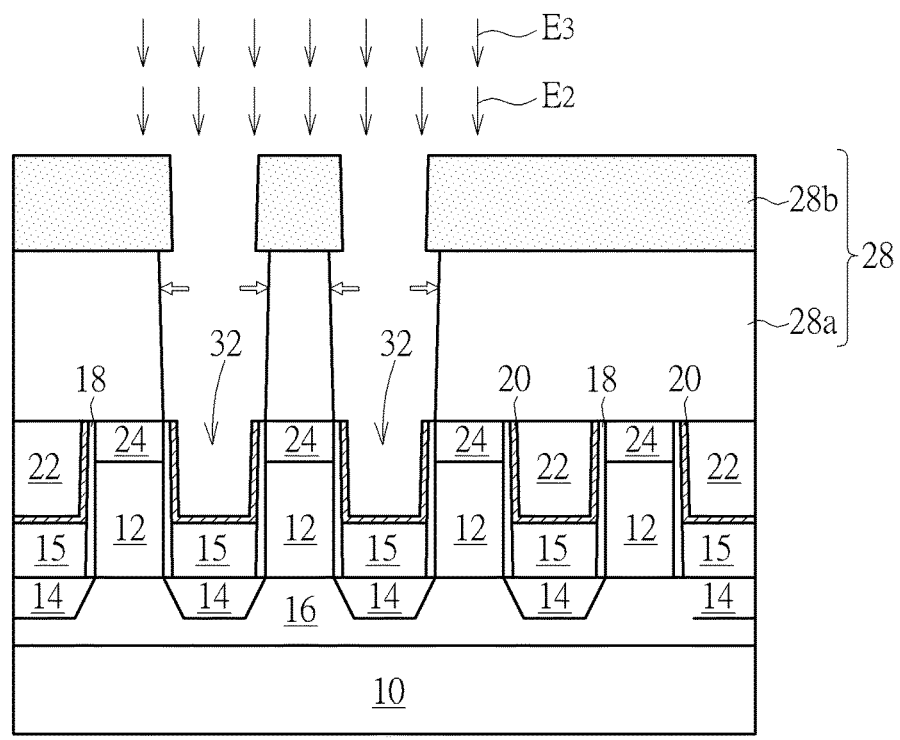
FIG. 4 is schematic diagram illustrating a semiconductor device according to a first preferred embodiment of the present invention while a pullback issue occurs.

However, in the process mentioned above, a potential issue may happen: during the process for etching the ODL 28a, since the ODL 28a is a material that is easy to be etched, if the process for etching the ODL 28a cannot be controlled exactly, the ODL 28a is easy to be over-etched, and causing a "pullback" issue, which means the inner surface of the opening or the contact holes is over-etched and expended outwardly. As shown in FIG. 4, when the over-etching issue (pullback) happens, it will influence the size of the contact holes which are formed in the following steps, and thereby cause some other issues such as shorting or mis-alignment.

Figure 5:
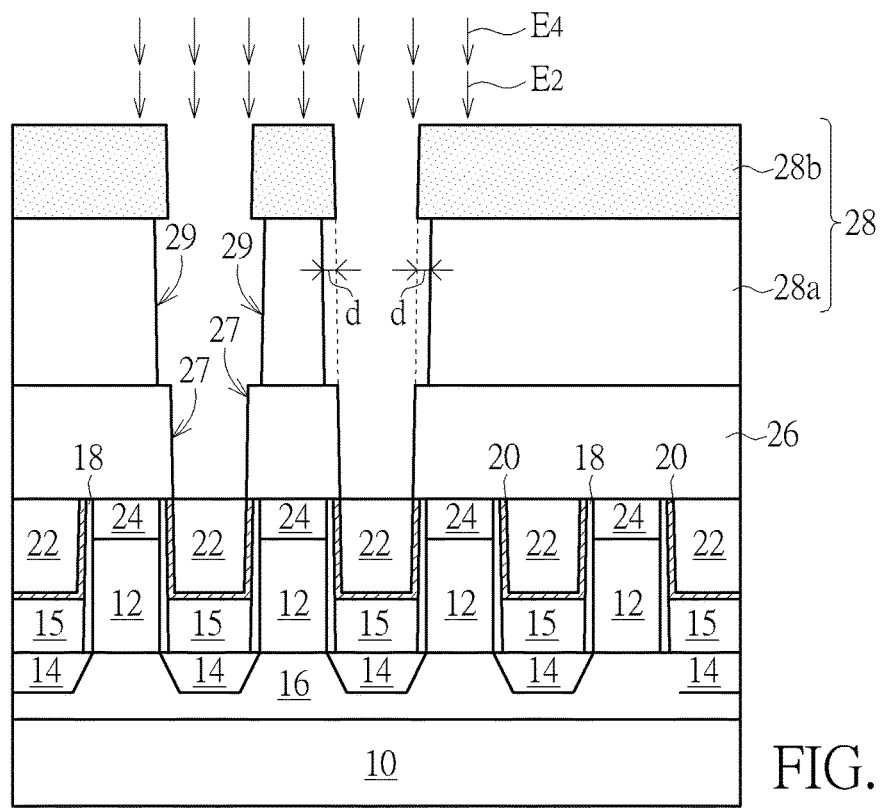
FIGS. 5-7 are schematic diagrams illustrating a manufacturing method of the semiconductor device according to a second preferred embodiment of the present invention.
Figure 6:
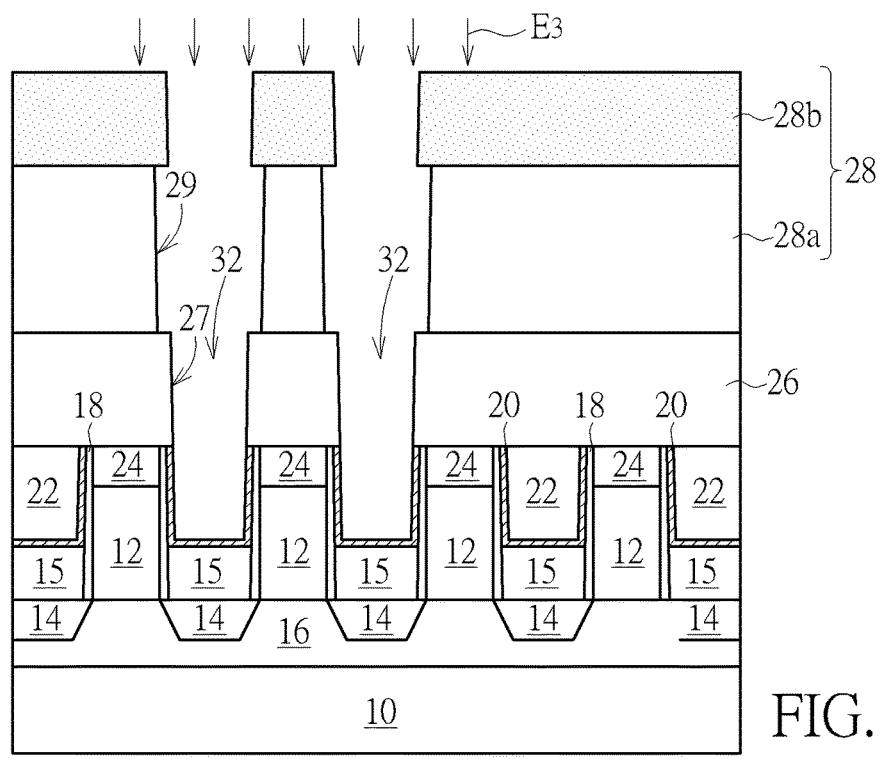

To solve the issues mentioned above, in the second embodiment of the present invention, please refer to FIGS. 5-6, which show the semiconductor device according to a first preferred embodiment of the present invention. As shown in FIG. 5, the steps are substantially similar to that of in the first preferred embodiment mentioned above, but after the metal gates 12 and the first ILD 22 are formed, and the CMP process is performed, the first ILD 22 has a flat top surface. Afterwards, a hard mask material layer 26 is further formed on the flat top surface of the first ILD 22. Next, the tri-layer hard mask 28, including the ODL 28a, the SHB 28b and the PR layer (not shown), is then formed on the hard mask material layer 26. In this embodiment, the hard mask material layer 26 is preferably a single layer, such as a deep ultraviolet light absorbing layer (for example, the present invention uses DUO™ as the hard mask material layer, which is a product manufactured by Honeywell company). Afterwards, the M0CT etching process is performed, to pattern the photoresist layer 28c and to form a plurality of first patterns 30 on the photoresist layer 28c through the first etching process (not shown in FIG. 4) mentioned in the first preferred embodiment.

Besides, in this embodiment, the M0CT etching process also includes a fourth etching process for etching the hard mask material layer 26. As shown in FIGS. 5-6, the second etching process E2 and the fourth etching process E4 are performed in sequence, to transfer the first patterns to other layers disposed below, including the SHB layer 28b, the ODL 28a, the hard mask material layer 26 and the first ILD 22 in sequence. In this embodiment, the second etching E2 process is used for removing the ODL 28a and the SHB layer 28b, the fourth etching process E4 is used for removing the hard mask material layer 26, and the third etching process E3 is used for removing the first ILD 22. Preferably, the second etching process E2 uses a hydrogen/nitrogen ($H_2/N_2$) gas for removing the ODL 28a and the SHB layer 28b, the fourth etching process E4 uses the fluorocarbons such as tetrafluoromethane ($CF_4$) gas for removing the hard mask material layer 26, and the third etching process E3 uses an argon/oxygen ($Ar/O_2$) gas for removing the first ILD 22, but not limited thereto. The solvent or gas in each step can be adjusted according to actual requirements.

It is noteworthy that after the ODL 28a is patterned (after the second etching process mentioned above), and during the step for etching the hard mask material layer 26 (the fourth etching process), as shown in FIG. 5, the SHB 28b and the ODL 28a are used as the hard mask, covering parts of the hard mask material layer 26, and the exposed part of the hard mask material layer 26 is removed during the etching process. In this embodiment, the lateral etching rate for etching the hard mask material layer 26 is smaller than the lateral etching rate for etching the ODL 28a. In other words, during the fourth etching process E4, a sidewall 27 of the hard mask material layer 26 is hardly etched more than a sidewall 29 of the ODL 28a is. Therefore, after the etching process is performed, the sidewall 29 of the ODL 28a may "pullback" outwardly for a distance (d), but the sidewall 27 of the hard mask material layer 26 is hardly pulled back, or the pullback distance is much smaller than the distance (d).

Next, as shown in FIG. 6, after the M0CT etching process E1 is performed, the third etching process E3 is then performed, so as to form a plurality of openings (contact holes) 32 in the first ILD 22, and the S/D region 14 or the epitaxial layer 15 is finally exposed by the contact holes 32. Compared with the first preferred embodiment mentioned above, the hard mask material layer 26 is further formed on and directly contacts the first ILD 22, disposed between the first ILD 22 and the tri-layer hard mask 28. Therefore, the hard mask material layer 26 is disposed below the ODL 28a and directly contacts it. During the etching process for removing the hard mask material layer 26, since the sidewall 27 of the hard mask material layer 26 is hard to be etched, the sidewall 27 of the hard mask material layer 26 will not be removed, thereby avoiding the pullback issue of the sidewall 27 of the hard mask material layer 26, and preventing the contact holes 32 from shorting or mis-alignment.

Afterwards, an ashing process (such as a dry etching process, not shown) is performed, to entirely remove the ODL 28a and the rest of the SHB layer 28b. In addition, a wet etching process (not shown) is also performed, to remove the rest of the hard mask material layer 26. In this embodiment, the hard mask material layer 26 can be removed through the dilute hydrofluoric acid (DHF) and the dilute tetra methyl ammonium hydroxide, dilute TMAH, but not limited thereto.

Figure 7:
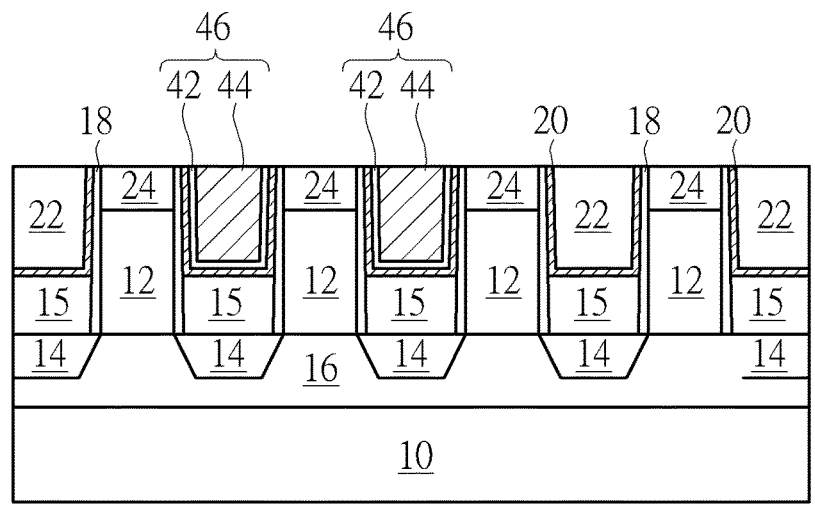

Finally, as shown in FIG. 7, a barrier layer 42 and a conductive layer 44 are filled into each contact hole, so as to form a plurality of contact plugs 46. The barrier layer 42 can include titanium nitride (TiN) or tantalum nitride (TaN). And the conductive layer 44 may include materials with low resistance and superior gap-filling characteristic, such as W, Al, TiAl, or titanium aluminum oxide (TiAlO), but not limited to this. The method for forming the contact plugs is a well-known technology and will not be redundantly described here.

Figure 8:
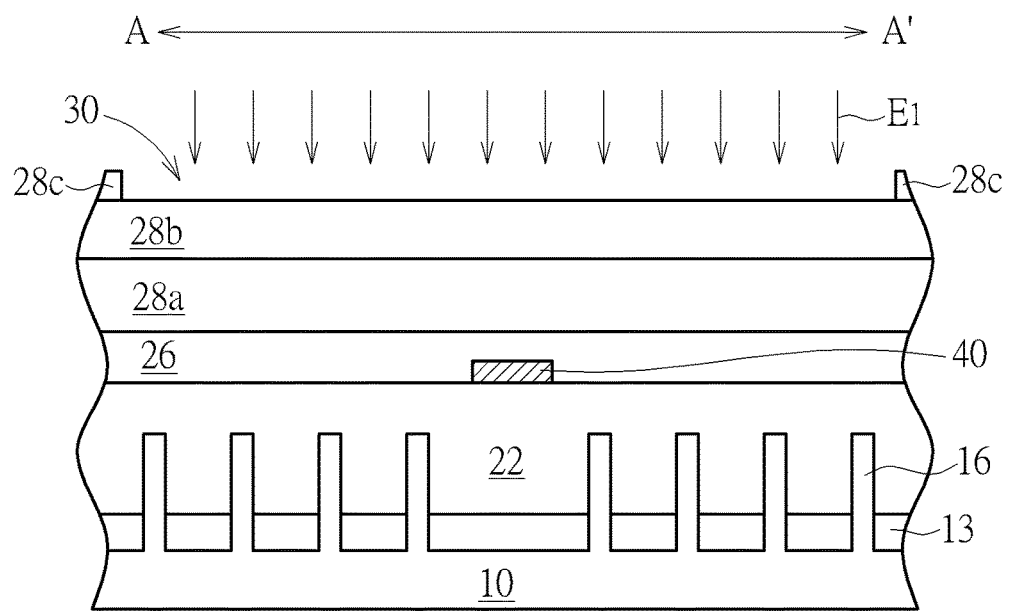
Figure 9:
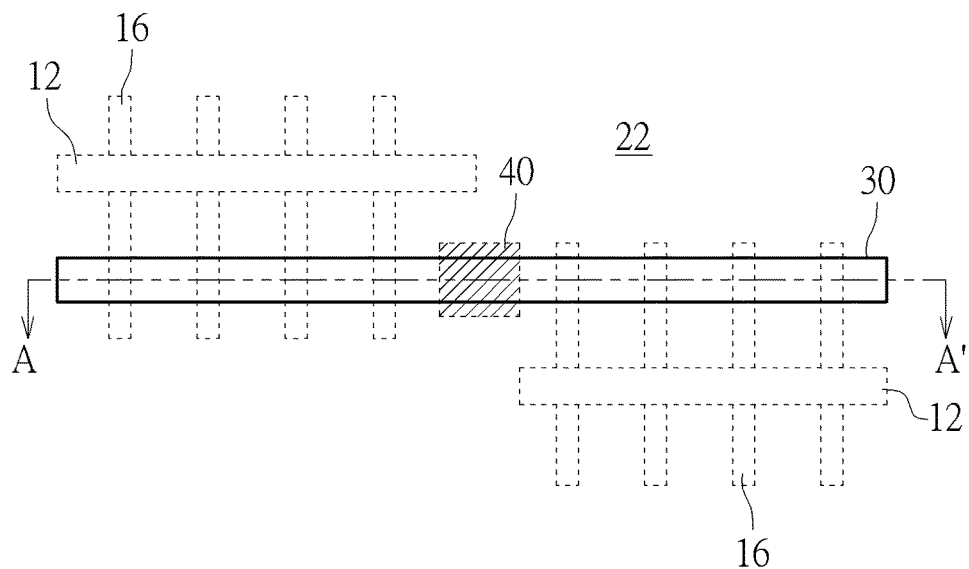
Figure 10:
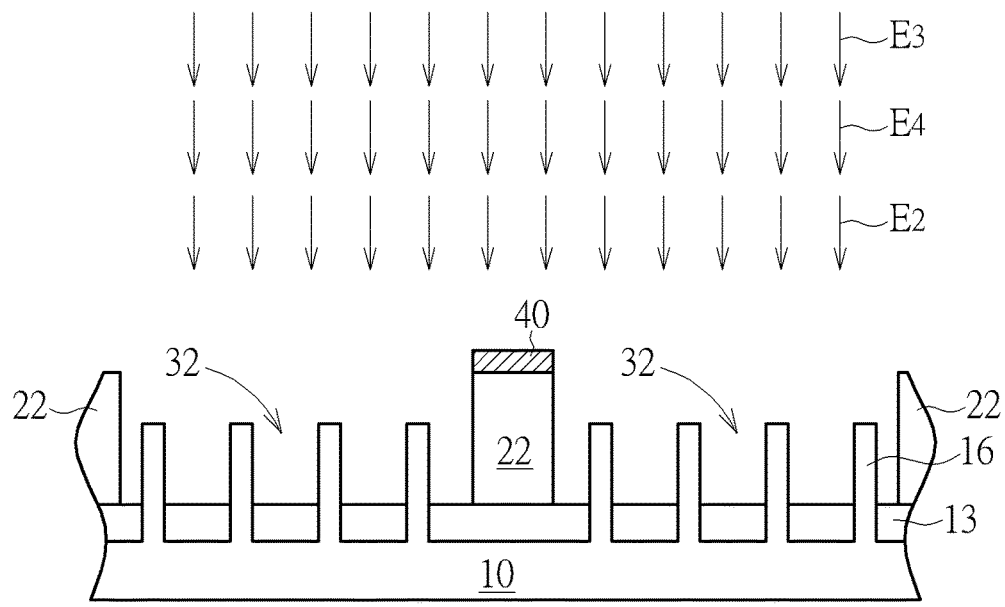

In the third embodiment of the present invention, please refer to FIGS. 8-9, wherein FIG. 9 shows a top view diagram of the semiconductor device according to the third preferred embodiment, and FIG. 8 is the cross section diagram of the semiconductor device along the cross section line A-A' in FIG. 9. In this embodiment, to avoid the rounding edge issue during the photolithography process for forming the contact holes, a slot contact cutting process may be performed. More precisely, after the fin structure 16, an shallow trench isolation 13, the metal gates 12 and the first ILD 22 are formed, a cutting element 40 is further formed on the first ILD 22, and the cutting element 40 is made of the material different from that of the ODL and the hard mask material layer that was mentioned in the first or second preferred embodiment, such as titanium nitride (TiN), but not limited thereto. Next, the M0CT etching process E1 is then performed, so as to form at least one first patterns 30 on the photoresist layer 28c. It is noteworthy that in this embodiment, each first pattern 30 on the photoresist layer 28c is a slot pattern, when viewed in top view. Referring to FIG. 9, the cutting element 40 covers a partial region of the first ILD 22, used to protect these regions, the first patterns 30 partially overlaps the cutting element 40, and after the first pattern 30 is transferred into other layers disposed below, as shown in FIG. 10, since the cutting element 40 cannot be removed during the etching process, it will still be disposed on the first ILD 22 after the M0CT etching process E1-E4 is performed. In this way, the cutting element will protect the first ILD that disposed right below it, and the first patterns 30 may be divided into two contact holes 32 in the first ILD.

In this embodiment, similar to the second preferred embodiment mentioned above, afterwards, an ashing process (such as a dry etching process, not shown) is performed, to entirely remove the ODL (not shown) and the rest of the SHB layer (not shown). In addition, a wet etching process (not shown) is also performed, to remove the rest of the hard mask material layer (not shown) and the cutting element 40. In this embodiment, the cutting element 40 can be removed through a sulfuric acid-hydrogen peroxide mixture (SPM) and a standard clean 1 (SC1) process, and the hard mask material layer can be removed through the dilute hydrofluoric acid (DHF) and the dilute tetra methyl ammonium hydroxide, dilute TMAH, but not limited thereto.

In summary, the feature of the present invention is that besides forming the tri-layer hard mask on a target layer (in this present invention, the target layer is the first ILD), further forming the hard mask material layer disposed between the first ILD and tri-layer hard mask. Since during the step for removing or patterning parts of the hard mask material layer, a lateral etching rate of the hard mask material layer is smaller than a lateral etching rate of the ODL, the pullback issue will not occur on the sidewall of the hard mask material layer, thereby preventing the contact holes from shorting or mis-alignment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an opening, comprising:
   forming a hard mask material layer on a target layer, wherein the hard mask material layer is a single layer structure;
   forming a tri-layer hard mask on the hard mask material layer, wherein the tri-layer hard mask includes an bottom organic layer (ODL), a middle silicon-containing hard mask bottom anti-reflection coating (SHB) layer and a top photoresist layer;
   performing an etching process, to remove parts of the tri-layer hard mask, parts of the hard mask material layer and parts of the target layer in sequence, so as to form at least one opening in the target layer, wherein during the step for removing parts of the hard mask material layer, a lateral etching rate of the hard mask material layer is smaller than a lateral etching rate of the ODL; and
   forming a cutting element on the target layer, and the cutting element still remains on the target layer after the etching process is performed.

2. The method of claim 1, wherein the hard mask material layer is a deep ultraviolet light absorbing (DUO) layer.

3. The method of claim 2, wherein the target layer contacts the hard mask material layer directly.

4. The method of claim 2, wherein the ODL contacts the hard mask material layer directly.

5. The method of claim 1, wherein the target layer is an interlayer dielectric (ILD).

6. The method of claim 1, wherein the target layer is a single layer structure.

7. The method of claim 1, wherein a top surface of the target layer is a flat surface, and the hard mask material layer is disposed on the flat surface.

8. The method of claim 1, further comprising performing a clean process to remove the cutting element entirely after the opening is formed.

9. The method of claim 1, further comprising filling a conductive layer in the opening, to form a contact plug, wherein the contact plug is electrically connected to at least one source/drain (S/D) region.

10. The method of claim 1, wherein the etching process comprises a first etching step for removing the bottom organic dielectric layer (ODL) and a middle silicon-containing hard mask bottom anti-reflection coating (SHB) layer, a second etching step for removing the hard mask material layer, and a third etching step for removing the target layer.

11. The method of claim 10, wherein using a hydrogen/nitrogen ($H_2/N_2$) gas during the first etching step is performed.

12. The method of claim 10, wherein using a tetrafluoromethane ($CF_4$) gas during the second etching step is performed.

13. The method of claim 10, wherein using an argon/oxygen ($Ar/O_2$) gas during the third etching step is performed.

14. The method of claim 1, further comprising performing an ashing process for at least removing the ODL entirely after the opening is formed.

15. A method for forming an opening, comprising:

forming a deep ultraviolet light absorbing (DUO) layer on a target layer;

forming a tri-layer hard mask on the DUO layer, wherein the tri-layer hard mask includes an bottom organic layer (ODL), a middle silicon-containing hard mask bottom anti-reflection coating (SHB) layer and a top photoresist layer; and performing an etching process, to remove parts of the tri-layer hard mask, parts of the DUO layer and parts of the target layer in sequence, so as to form at least one opening in the target layer, wherein during the step for removing parts of the hard mask material layer, a lateral etching rate of the hard mask material layer is smaller than a lateral etching rate of the ODL.

16. The method of claim 15, wherein the target layer contacts the DUO layer directly.

17. The method of claim 15, wherein a top surface of the target layer is a flat surface, and the DUO layer is disposed on the flat surface.

18. The method of claim 15, further comprising forming a cutting element on the target layer, and the cutting element still remains on the target layer after the etching process is performed.

* * * * *